United States Patent [19]
Kosaki

[11] Patent Number: 5,338,967
[45] Date of Patent: Aug. 16, 1994

[54] SEMICONDUCTOR DEVICE STRUCTURE WITH PLATED HEAT SINK AND SUPPORTING SUBSTRATE

[75] Inventor: Katsuya Kosaki, Itami, Japan
[73] Assignee: Mitsubishi Denki Kabushiki Kaisha, Tokyo, Japan
[21] Appl. No.: 57,790
[22] Filed: May 6, 1993
[30] Foreign Application Priority Data Jan. 12, 1993 [JP] Japan .................. 5-003034

[51] Int. Cl.⁵ .............................. H01L 23/02
[52] U.S. Cl. ..................... 257/620; 257/707; 257/706; 257/720; 437/226
[58] Field of Search .......... 257/703, 706, 712, 720, 257/705, 713, 620, 707; 437/226, 227

[56] References Cited
U.S. PATENT DOCUMENTS

| | | | |
|---|---|---|---|
| 3,940,295 | 2/1976 | Lupton et al. | 148/38 |
| 4,376,287 | 3/1983 | Sechi | 257/705 |
| 4,897,508 | 1/1990 | Mahulikar et al. | 257/708 |
| 5,015,803 | 5/1991 | Mahulikar et al. | 257/703 |
| 5,138,439 | 8/1992 | Kobiki | 257/705 |

FOREIGN PATENT DOCUMENTS

| | | |
|---|---|---|
| 61-23350 | 1/1986 | Japan . |
| 61-77369 | 4/1986 | Japan . |
| 1-31444A | 2/1989 | Japan ............... 257/703 |
| 3232253 | 10/1991 | Japan . |
| 4144157 | 5/1992 | Japan . |

Primary Examiner—Sara W. Crane
Assistant Examiner—John F. Guay
Attorney, Agent, or Firm—Leydig, Voit & Mayer

[57] ABSTRACT

A semiconductor chip includes a semiconductor substrate having opposite front and rear surfaces and an active element on the front surface and a supporting substrate supporting the semiconductor substrate and disposed on the rear surface of the semiconductor substrate. The supporting substrate includes a radiating layer for radiating heat generated by the active element and disposed on a part of the rear surface of the semiconductor substrate directly opposite said active element and a plated metal layer of Rh, Pt, or Ni-B-W having a linear thermal expansion coefficient approximately equal to that of the semiconductor substrate and disposed on part of the rear surface of the semiconductor substrate but not directly opposite the active element. In this structure, the curvature of the chip during die-bonding is reduced. The plated metal layer is produced in a relatively simple process with no difficulty in controlling the composition of a plating solution. As a result, a semiconductor chip having improved heat radiation and RF characteristics is achieved.

10 Claims, 15 Drawing Sheets

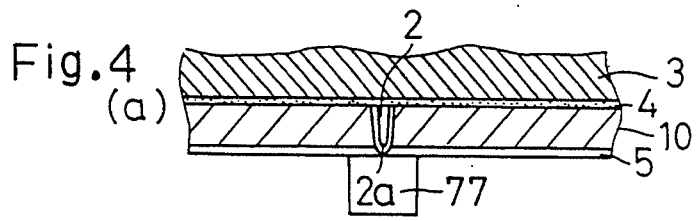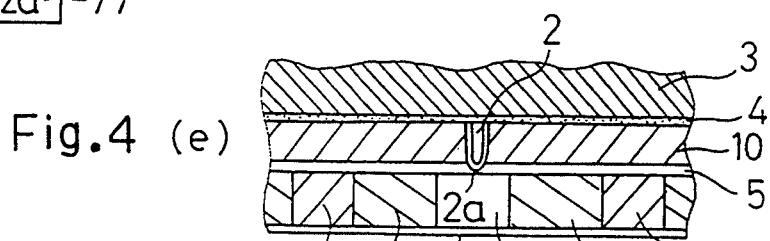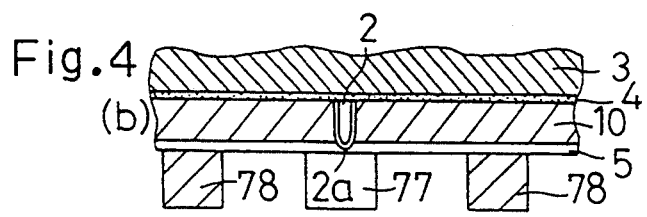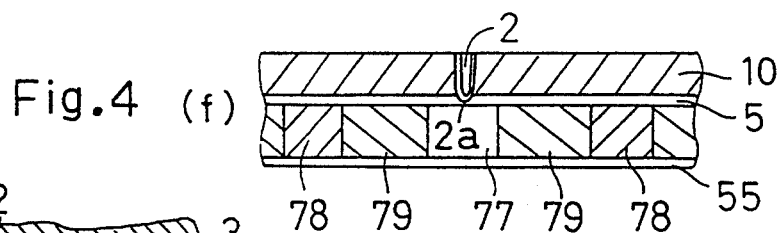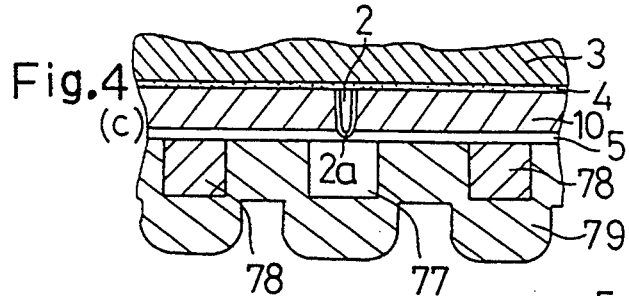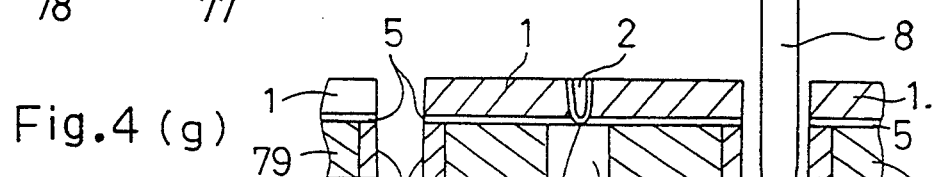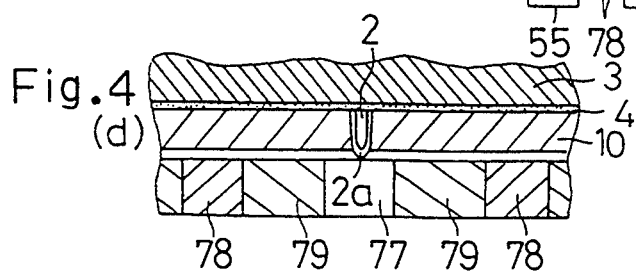

200

SEMICONDUCTOR DEVICE STRUCTURE WITH PLATED HEAT SINK AND SUPPORTING SUBSTRATE

FIELD OF THE INVENTION

The present invention relates to a semiconductor device and, more particularly, to a high frequency and high output semiconductor IC chip having a plated heat sink (hereinafter referred to as PHS). The invention also relates to methods for producing and mounting the semiconductor IC chip.

BACKGROUND OF THE INVENTION

FIGS. 9(a)–9(b) and 10(a)–10(b) are schematic diagrams illustrating a prior art high frequency and high output MMIC (Monolithic Microwave Integrated Circuit), in which FIG. 9(a) is a plan view, FIG. 9(b) is an enlarged view of a portion of FIG. 9(a), FIG. 10(a) is a cross-sectional view taken along line Xa—Xa of FIG. 9(a), and FIG. 10(b) is a cross-sectional view taken along line Xb—Xb of FIG. 9(b). Reference numeral 200 designates a GaAs MMIC chip including a plurality of active elements, such as field effect transistors (hereinafter referred to as FETs).

In FIG. 9(b), four drain electrodes 201a and four source electrodes 202a are alternatingly arranged in a line and a gate electrode 203a is disposed at every space between the drain and source electrodes. The drain electrodes 201a are connected to a common drain electrode 201 and the gate electrodes 203a are connected to a common gate electrode 203.

In FIG. 9(a), a pair of common drain electrodes 201 are connected to a drain bonding pad 221 via transmission lines 211, and a pair of common gate electrodes 203 are connected to a gate bonding pad 223 via transmission lines 213.

In FIGS. 10(a) and 10(b), an Au PHS 7 is disposed on the rear surface of the chip substrate 1 via a metal layer 5 which serves as a feeding layer when the Au PHS 7 is formed by electrolytic plating. The PHS 7 radiates heat generated by the elements on the surface of the chip substrate 1 to an underlying chip carrier (not shown) and mechanically supports the thin substrate 1, whereby the semiconductor IC chip is easily handled. The source electrodes 202a are connected to the Au PHS 7 via through-holes 2 penetrating the substrate 1 and the metal layer 5. The drain electrodes 201a, the common drain electrode 201, and the common gate electrodes 203 are omitted in FIG. 10(a).

A description is given of the production method.

FIGS. 11(a) to 11(f) are cross-sectional views taken along line Xa—Xa of FIG. 9(a) illustrating process steps in a method for producing the semiconductor chip.

Initially, active elements, such as FETs, transmission lines, and via-holes 2 are formed on chip regions of a GaAs wafer, which chip regions are separated from each other by chip separation lines, i.e., dicing lines (not shown). Thereafter, the surface of the wafer 10 is adhered to a glass plate 3 using wax 4, and the rear surface of the wafer is flattened by polishing until the thickness of the substrate becomes about 30 microns (FIG. 11(a)). Then, Au is applied to the rear surface of the wafer by vapor deposition or electroless plating to form an Au layer 5 which serves as a feeding layer when a PHS is plated in the subsequent process (FIG. 11(b)).

Then, a photoresist is applied to the feeding layer 5 to a thickness of about 40 microns and patterned leaving portions in place opposite the dicing lines on the surface of the wafer (FIG. 11(c)). Using the photoresist pattern 6 as a mask, an Au PHS 7 about 40 microns thick is formed on the rear surface of the wafer by electrolytic plating (FIG. 11(d)).

After removing the photoresist pattern 6 (FIG. 11(e)), the feeding layer 5 and the wafer 10 are selectively etched by wet etching using a mixture of sulfuric acid and hydrogen peroxide as an etchant and using the PHS 7 as a mask (FIG. 11(f)). In this way, the wafer 10 is divided into a plurality of semiconductor chips along the dicing lines.

Finally, the wax 4 is melted in a heated organic solvent to separate the semiconductor chips from the glass plate 3.

In the above-described production method of semiconductor chips, however, since the wafer 10 is divided into chips by etching during the wafer process, a test of high frequency characteristics of the respective semiconductor chips, which is usually performed with a grounding electrode on the rear surface of the wafer, is not performed automatically with respect to the wafer but performed manually with respect to each chip.

Furthermore, since the semiconductor chips are separated from each other after removing the glass plate 3, chip sorting, i.e., arrangement of semiconductor chips in the wafer according to characteristics of the respective chips, is not possible.

In order to solve the above-described problems, dicer cutting is employed to divide the wafer into chips. Figures 12(a) to 12(d) illustrate a method for producing semiconductor chips using the dicer cutting.

After adhering the GaAs wafer 10 to the glass plate 3 and forming the feeding layer 5 on the rear surface of the wafer (FIG. 12(a)), an Au PHS 7 about 40 microns thick is formed on the rear surface of the wafer by electroplating (FIG. 12(b)).

Then, the wax 4 is melted using a heated organic solvent to separate the glass plate 3 from the wafer 10, followed by cleaning (FIG. 12(c)). The wafer 10 is adhered to, for example, an expanded film (not shown) and then it is cut along the dicing lines using a dicing blade 8 (figure 12(d)), providing a semiconductor chip 200a.

In this method, since the dicer cutting of the wafer is carried out after separating the glass plate 3 from the wafer, the high frequency characteristic test can be performed before the dicer cutting. Furthermore, since the semiconductor chips after the dicing are adhered to the expanded film, chip sorting according to the results of the characteristics test can be performed.

During the dicer cutting, however, burrs 7a as long as the thickness of the Au PHS 7 are unfavorably produced on the rear surface of the chip 200a as shown in FIG. 13 due to the ductility of Au PHS 7. The burrs 7a cause an insufficient junction when the chip 200a is die-bonded on a chip carrier.

Furthermore, since the conventional semiconductor chips 200 and 200a unfavorably curve as shown in FIG. 14 regardless of the chip separation method, it is difficult to die-bond or wire-bond the chips onto the chip carrier. The curvature of the chip sometimes reduces the heat radiation characteristics and the RF characteristics of the chip. These problems will be described in more detail. FIG. 14 illustrates the semiconductor chip 200a mounted on the chip carrier 20. FIG. 15 is a graph illustrating the relation between the curvature of the semiconductor chip 200a and the length of the longer edge of the chip when the temperature of the chip is increased from 25° C. to 300° C. (temperature change Δt=275° C.) during the die-bonding.

When the semiconductor chip 200a is adhered onto the chip carrier using Au-Sn alloy solder, the chip carrier is heated to the melting point of the solder, i.e., about 300° C. Then, the chip 200a curves as shown in FIG. 14 due to the difference in thermal expansion coefficients between the substrate 1 and the Au PHS 7. It is well known that this curvature is calculated by the bimetal formula.

When the GaAs substrate 1 is about 30 microns thick, the Au PHS 7 is about 40 microns thick, and the temperature during the die-bonding is about 300° C., the relation between the curvature (t) and the length of the longer edge (l) calculated by the bimetal formula is approximately equal to the relation shown in FIG. 15.

Therefore, as shown in FIG. 15, if the length (l) of the chip 200a exceeds 2.55 mm, die-bonding and wire-bonding of the chip on the chip carrier 20 are almost impossible. In addition, a decrease in the contact area between the chip and the chip carrier adversely affects the heat radiation characteristics, with a result that desired RF characteristics are not attained.

Furthermore, when the chip 200a with the curvature is adhered to the chip carrier 20 using a pellet of Au-Sn eutectic solder, since it is difficult to control the quantity of the melted solder 9, the chip 200a sometimes floats on the solder 9 which is as thick as the PHS 7, i.e., about 40–50 microns, adversely affecting the heat radiation characteristics and the RF characteristics.

Since the semiconductor chip 200a has the burrs 7a on the rear surface, the increase in the solder 9 is unavoidable.

Furthermore, since an oxide film is formed on the surface of the Au-Sn solder 9, it is necessary to rub the chip 200a against the chip carrier 20 to remove the oxide film and increase the adhesion of the solder 9 to the chip carrier 20. In this case, it is very difficult to die-bond the semiconductor chip on a narrow region of the chip carrier 20 with high precision.

Meanwhile, Japanese Published Patent Application No. 4-144157 discloses an improved method for producing semiconductor chips with no curvature. In this method, a radiating layer for radiating heat generated by an active element on a semiconductor substrate is formed on a part of the rear surface of the substrate directly opposite the active element, and a metal layer having a linear thermal expansion coefficient equal to that of the substrate and different from that of the radiating layer is formed on part of the rear surface of the substrate but not directly opposite the active element.

In this prior art method, however, since the metal layer is formed by dispersion plating, it is necessary to precisely control the composition of the plating solution. More specifically, during the dispersion plating, the linear thermal expansion coefficient of the plated layer is controlled by the rate of the dispersion medium to the plating solution, and the rate has to be increased to approximate the linear thermal expansion coefficient of the plated layer to that of the substrate. However, the increase in the rate of the dispersion medium to the plating solution adversely affects the electroplating. Therefore, it is very difficult to control the composition of the plating solution.

This prior art publication also discloses a process of alternatingly laminating a Mo film and a Ni film to produce the above-described plated metal layer. In this case, however, an Au film is needed between the Mo film and the Ni film to improve the adhesion between these films, resulting in a complicated process.

Meanwhile, Japanese Published Patent Application No. 3-232253 discloses another method for producing semiconductor chips, in which chip separation grooves, i.e., dicing grooves, are formed on a wafer by etching, the grooves are filled with Ni by electroless plating, Au PHS layers are selectively formed on the rear surface of the wafer opposite the regions where the grooves are absent, and the wafer is divided into a plurality of chips along the grooves using a dicer. Since the Au PHS layers are not present opposite the dicing grooves, no burr is produced on the rear surface of the semiconductor chip.

In the semiconductor chips produced according to the above-described method, however, portions of the plated Ni layer remaining at opposite sides of the chip are unfavorably in contact with bonding wires when the chip is mounted on a chip carrier, resulting in a short circuit that reduces the reliability of the device. In addition, when the surface of the wafer is adhered to a glass plate, the wafer is not parallel to the glass plate due to the plated Ni layers in the grooves, and a stress is applied to the Ni layers from the glass plate, cracking the wafer.

SUMMARY OF THE INVENTION

It is an object of the present invention to provide high frequency and high output semiconductor chips with improved heat radiation characteristics and RF characteristics, which are manufactured in a relatively simple process with reduced curvature of each semiconductor chip.

It is another object of the present invention to provide a method for producing high frequency and high output semiconductor chips that reduces burrs due to the dicer cutting, prevents short circuit during the wire bonding of each chip, and prevents the semiconductor wafer from cracking.

It is still another object of the present invention to provide a method for producing high frequency and high output semiconductor chips in which a high frequency characteristic test of the respective semiconductor chips in the wafer is possible.

It is yet another object of the present invention to provide a method for die-bonding a semiconductor chip on a chip carrier in which the semiconductor chip is positioned on a prescribed narrow region of the chip carrier with high precision and the curvature of the chip is reduced.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor chip includes a semiconductor substrate having opposite front and rear surfaces and an active element on the front surface, and a supporting substrate for supporting the semiconductor substrate disposed on the rear surface of the semiconductor substrate. The supporting substrate includes a radiating layer for radiating heat generated by the active element disposed on a part of the rear surface of the semiconductor substrate directly opposite the active element, and a ceramic layer or a plated metal layer comprising Rh, Pt, or Ni-B-W, having a linear thermal expansion coefficient nearer to that of the semiconductor substrate than that of the radiating layer, which is disposed on part of the rear surface of the semiconductor substrate but not directly opposite the active element. Alternatively, the plated metal layer comprises, alternatingly laminated, Au and a metal film selected from Rh, Pt, and Ni-B-W. In this structure, the curvature of the chip during the die-bonding is reduced. The plated metal layer and the ceramic layer are produced in a relatively simple process without difficulty in controlling the composition of the plating solution or the ceramic paste.

According to a second aspect of the present invention, the supporting substrate further includes plated hard metal layers comprising metal harder than other portions of the supporting substrate, which are disposed on the rear surface of the semiconductor substrate directly opposite dicing lines along which said semiconductor chip is separated from a semiconductor wafer by dicer cutting. Therefore, no burr is produced during the dicer cutting. In addition, the hard metal layers included in the supporting substrate do not cause short circuits during wire-bonding.

According to a third aspect of the present invention, in a method for producing semiconductor chips, a relatively hard metal is selectively plated on portions on the rear surface of a semiconductor wafer opposite dicing lines on the wafer, and the plated hard metal layers are cut through by a dicer to divide the wafer into chips. Therefore, a high frequency characteristic test of the wafer is possible. In addition, no burr is produced during the dicer cutting.

According to a fourth aspect of the present invention, a method for producing semiconductor chips includes forming active elements on a plurality of chip regions on the surface of a semiconductor wafer, which chip regions are separated from each other by dicing lines, selectively etching the wafer substrate to form dicing grooves along the dicing lines, forming metal layers in the dicing grooves, selectively plating metal on regions of the rear surface of the wafer opposite the active elements to produce radiating layers, selectively plating relatively hard metal on regions of the rear surface of the wafer opposite the dicing grooves to a thickness equal to that of the radiating layer, forming plated metal layers or ceramic layers for supporting the wafer on regions of the rear surface of the wafer where the radiating layers and the hard metal layers are absent, and cutting through the hard metal layers along the dicing lines with a dicing blade to produce a plurality of semiconductor chips. In this method, the wafer is divided into a plurality of chips before the dicer cutting, so that the wafer is prevented from breaking or cracking due to mechanical stress applied to the wafer during the wafer test. In addition, since the wafer is divided into chips by only cutting through the plated hard metal layers along the dicing grooves, workability during the dicer cutting is improved.

According to a fifth aspect of the present invention, a method for mounting a semiconductor chip on a chip carrier includes applying Au-Sn solder on the rear surface of a semiconductor chip, exposing the solder layer to a reducing atmosphere to remove an oxide film on the surface of the solder layer, putting the semiconductor chip on the solder layer, and cooling the chip and carrier to the room temperature while pressing the chip onto the carrier using a collet or the like. Therefore, the step of rubbing the semiconductor chip against the chip carrier to increase the adhesion between the solder and the chip carrier can be dispensed with. In addition, since the quantity of the solder is controlled by the thickness of the solder layer, the pressed-out portion of the solder beneath the semiconductor chip is reduced.

BRIEF DESCRIPTION OF THE DRAWINGS

FIGS. 4(a)-4(g) are cross-sectional views illustrating process steps in a method for producing the semiconductor chip of FIG. 3;

DETAILED DESCRIPTION OF THE PREFERRED EMBODIMENTS

Figure 1:
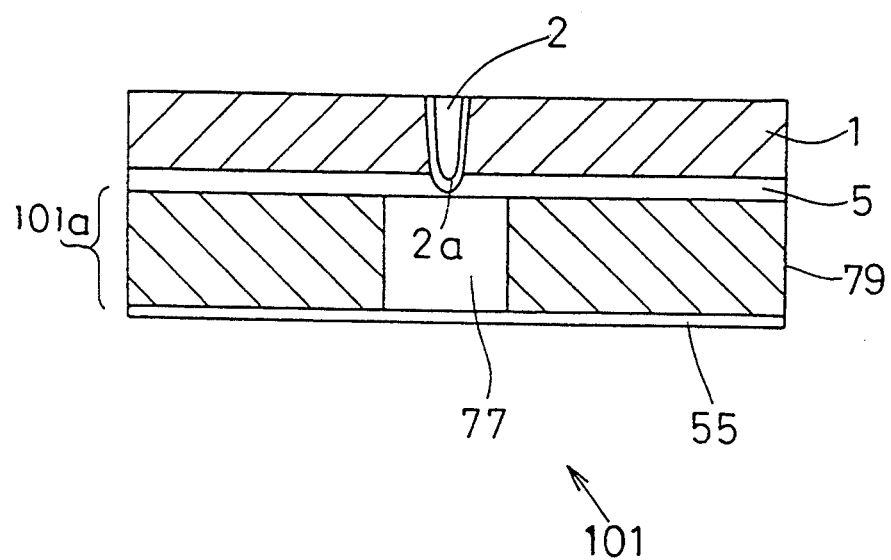
FIG. 1 is a cross-sectional view illustrating a high frequency and high output semiconductor chip in accordance with a first embodiment of the present invention.

FIG. 1 is a cross-sectional view illustrating a high frequency and high output semiconductor chip in accordance with a first embodiment of the present invention. In the figure, a GaAs substrate 1 includes a semiconductor active element (not shown), such as FET, and a via-hole 2. A chip supporting substrate 101a for radiating heat generated by the active element and for mechanically supporting the GaAs substrate 1 is disposed on the rear surface of the GaAs substrate 1 via a metal layer 5. The chip supporting substrate 101a comprises an Au PHS 77 for heat radiation disposed opposite the active element and a chip supporting layer 79 disposed on opposite sides of the PHS 77. An Au plated layer 55 is disposed over the rear surface of the chip supporting substrate 101a. The chip supporting substrate 101a is about 40 microns thick.

Figure 16:
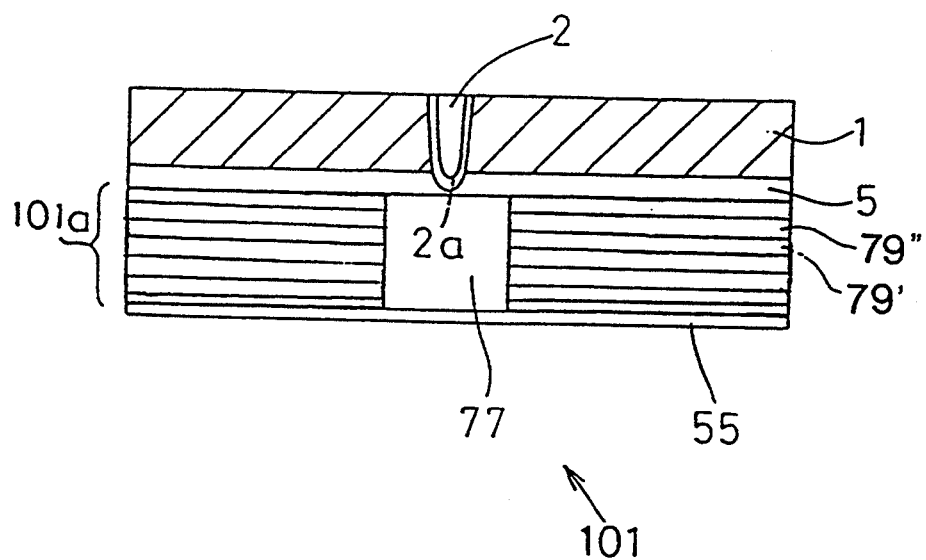
FIG. 16 is a cross-sectional view illustrating a high frequency and high output semiconductor chip in accordance with an alternative first embodiment of the present invention.

The chip supporting layer 79 comprises a plated metal film, such as a Pt film, an Rh film, or an Ni-B-W alloy film. Alternatively, as illustrated in FIG. 16, the chip supporting layer 79 comprises alternatingly laminated first and second plated metal films 79' and 79", and the first film 79' being selected from the above-described metal films and the second film 79" being an Au film. In addition, the PHS 77 may be a Cu PHS.

The linear expansion coefficients of materials of the GaAs substrate 1 and the respective plated metal layers are $6.5 \times 10^{-6}/°$ C. for GaAs, $14.2 \times 10^{-6}/°$ C. for Au, $16.5 \times 10^{-6}/°$ C. for Cu, $8.2 \times 10^{-6}/°$ C. for Rh, $8.8 \times 10^{-6}/°$ C. for Pt, and $10 \times 10^{-6}/°$ C. for Ni-B-W.

In this first embodiment, since the chip supporting layer 79 comprises one of the above-described plated metal films, the thermal stress applied to the chip substrate 1 is reduced, whereby the curvature of the chip is reduced.

FIGS. 2(a)-2(h) are cross-sectional views illustrating process steps in a method for producing the semiconductor chip of FIG. 1.

Figure 2:
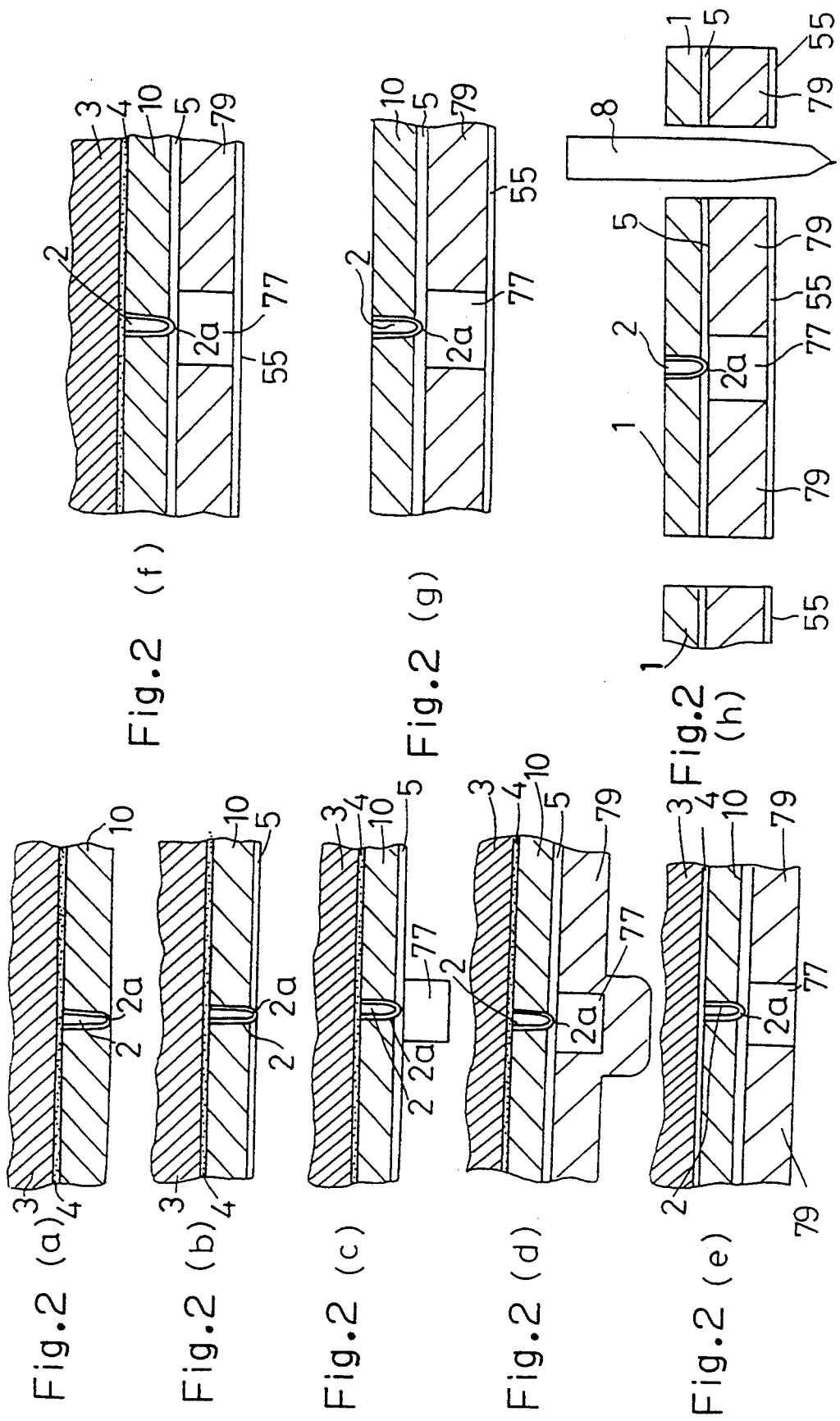
FIGS. 2(a)-2(h) are cross-sectional views illustrating process steps in a method for producing the semiconductor chip of FIG. 1.
Figure 11A:
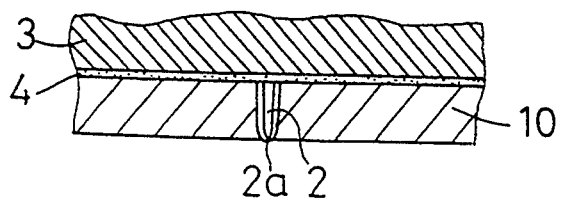
FIGS. 11(a)-11(f) are cross-sectional views illustrating a method for producing semiconductor chips in which a wafer is divided into chips by etching in accordance with the prior art.
Figure 11B:
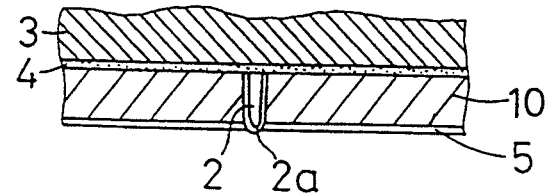
Figure 11C:
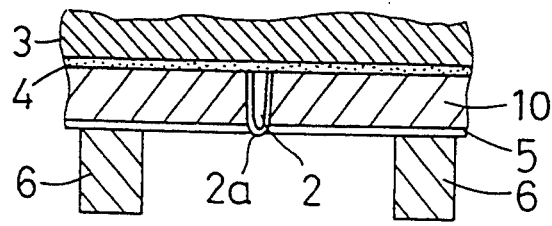
Figure 11D:
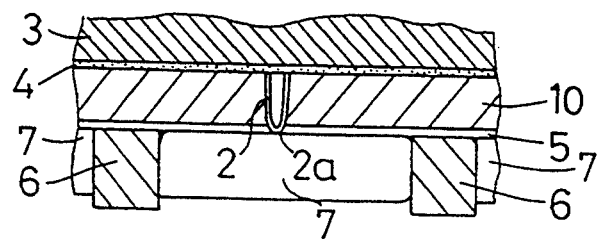
Figure 11E:
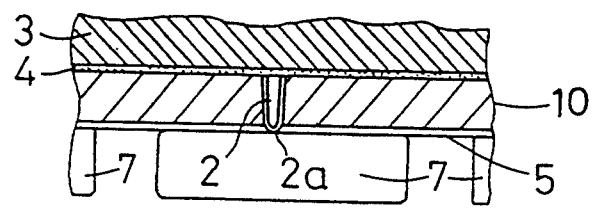
Figure 11F:
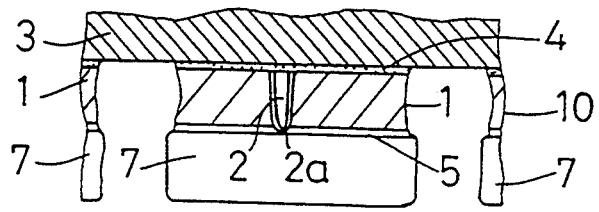
Figure 12A:
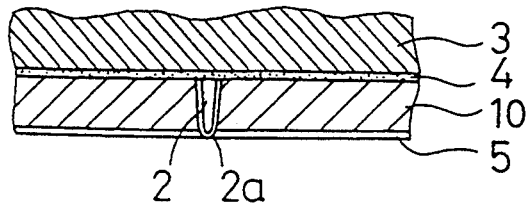
FIGS. 12(a)-12(d) are cross-sectional views illustrating a method for producing semiconductor chips in which a wafer is divided into chips by dicer cutting in accordance with the prior art.
Figure 12B:
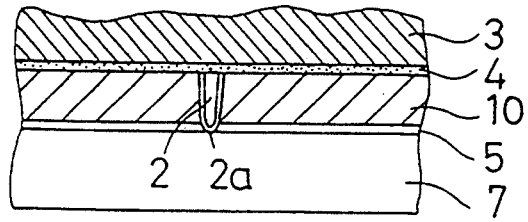
Figure 12C:
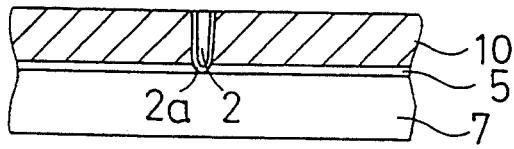
Figure 12D:
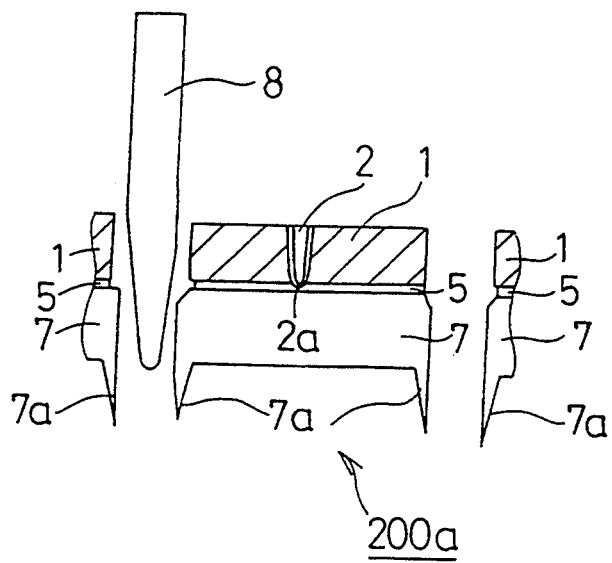
Figure 13:
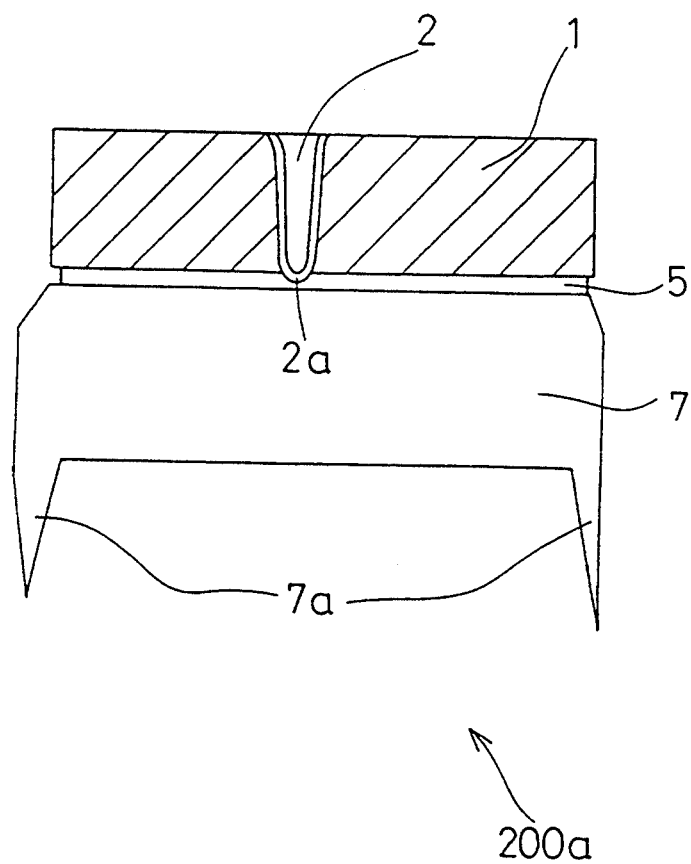
FIG. 13 is a cross-sectional view illustrating a semiconductor chip which is separated from a wafer by dicer cutting according to the prior art.
Figure 14:
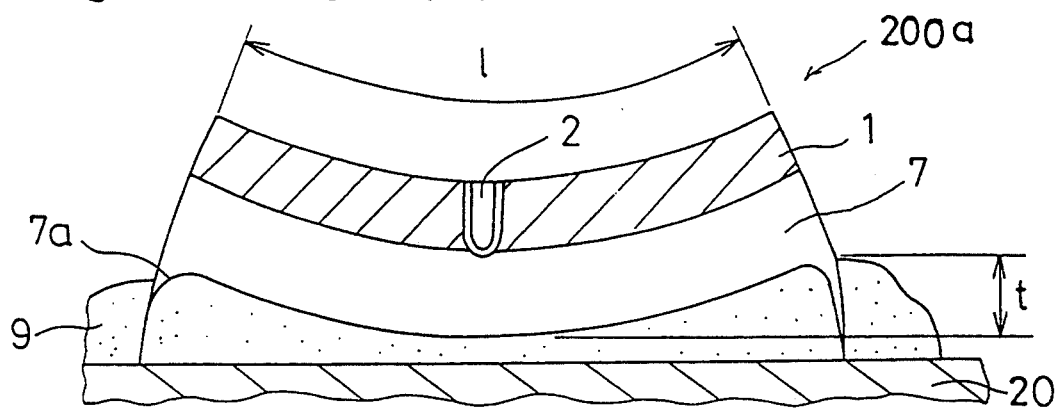
FIG. 14 is a cross-sectional view illustrating the semiconductor chip of FIG. 13 mounted on a chip carrier.
Figure 15:
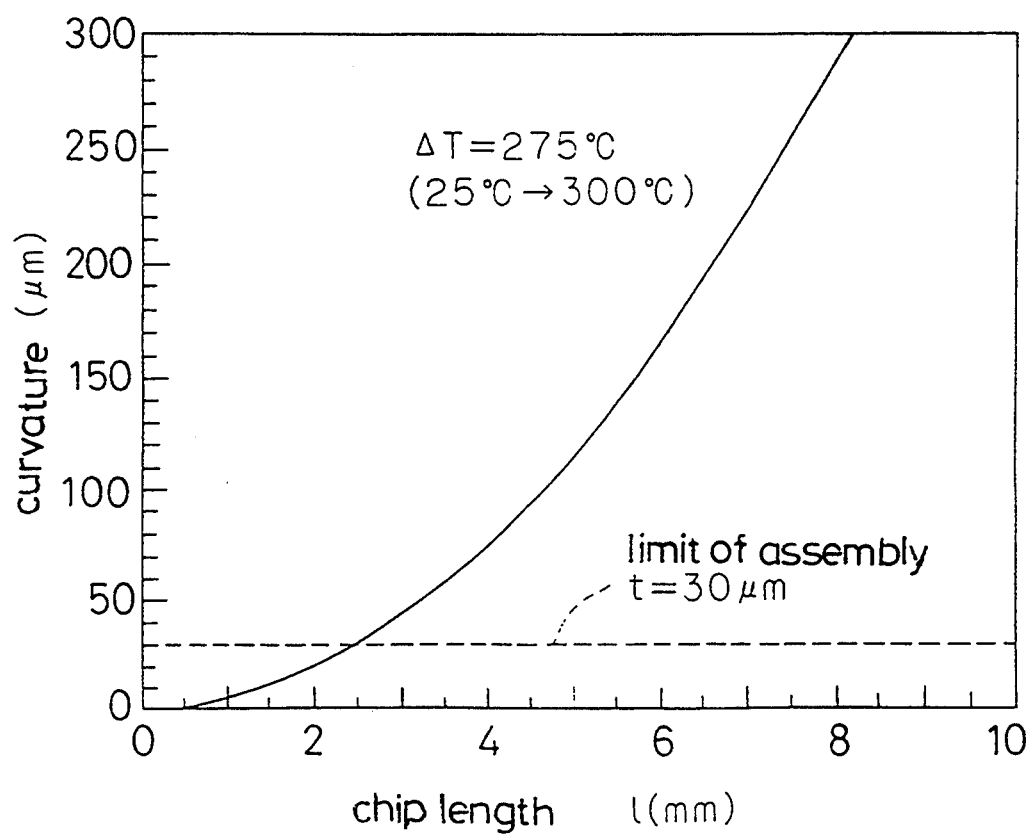
FIG. 15 is a graph illustrating the relation between the curvature of the semiconductor chip of FIG. 13 and the length of the longer edge of the chip when the temperature of the chip is increased from 25° C. to 300° C. during die-bonding.

The steps illustrated in FIGS. 2(a) and 2(b) are identical to those already described with respect to FIGS. 11(a) and 11(b) and, therefore, do not require repeated description. In FIG. 2(b), the wafer 10 is about 40 microns thick and the Au feeding layer 5 is 2-5 microns thick.

In FIG. 2(c), an electrolytic plating is carried out using the Au feeding layer 5 as a plating electrode and using a photoresist (not shown) as a mask, forming Au PHS layers 77 about 40 microns thick on portions of the rear surface of the GaAs wafer 10 opposite the active elements on the wafer 10.

Then, a metal having a linear thermal expansion coefficient approximately equal to that of the GaAs wafer, for example, Rh, Pt, or Ni-B-W, is plated on the rear surface of the wafer to a thickness of about 40 microns (FIG. 2(d)). Alternatively, one selected from the above-described metals and Au may be alternatingly laminated to a thickness of about 40 microns. Thereafter, the plated metal layer 79 is polished to expose the Au PHS layers 77 (FIG. 2(e)).

Then, Au is plated over the rear surface of the wafer to a thickness of 2-5 microns (FIG. 2(f)). Then, the wax 4 is removed using an organic solvent or the like to separate the glass plate 3 from the wafer 10 (figure Finally, the wafer is cut along the dicing lines with a dicing blade 8 to produce a plurality of semiconductor chips (FIG. 2(h)).

According to the first embodiment of the present invention, the chip supporting substrate 101a comprises the PHS 77 disposed opposite the active element of the chip and the chip supporting layer 79 disposed at opposite sides of the PHS 77. The chip supporting layer 79 comprises the plated metal film having a linear thermal expansion coefficient approximately equal to that of the chip substrate 10. Therefore, the curvature of the chip during the die-bonding process is reduced.

The step of producing the chip supporting metal layer 79 is not complicated because the metal layer is easily formed using a single plating solution or by only alternatingly laminating two kinds of metal films.

While in the above-described first embodiment the chip supporting layer 79 comprises plated metal, it may comprise silica (SiO) ceramic, for example, Ceramacoat 512 of Aremco Products (U.S.A.). Since Ceramacoat 512 is suitable for coating and curing at room temperature and has a linear thermal expansion coefficient equivalent to that of GaAs ($6.2 \times 10^{-6}/°$ C.), it is applicable to the method of the present invention with the same effects as described above.

The chip supporting layer 79 comprising a ceramic is produced as follows. After forming the Au PHS layers 77 (FIG. 2(c)), a paste comprising silica ceramic dispersed in a solvent is applied over the rear surface of the wafer and then it is dried to evaporate the solvent. The thus-formed ceramic layer is polished to expose the Au PHS layers 77 (FIG. 2(d)), followed by an annealing at 100°-150° C. to cure the ceramic layer. Then, a conductive layer is formed over the rear surface of the wafer by electroless plating, and the Au film 55 is formed thereon by electrolytic plating using the conductive layer as a feeding electrode. Finally, the wafer is divided into chips by dicer cutting (FIG. 2(h)). Since the chip supporting layer 79 comprises a ceramic, burrs are hardly produced on the rear surface of the semiconductor chip.

Figure 3:
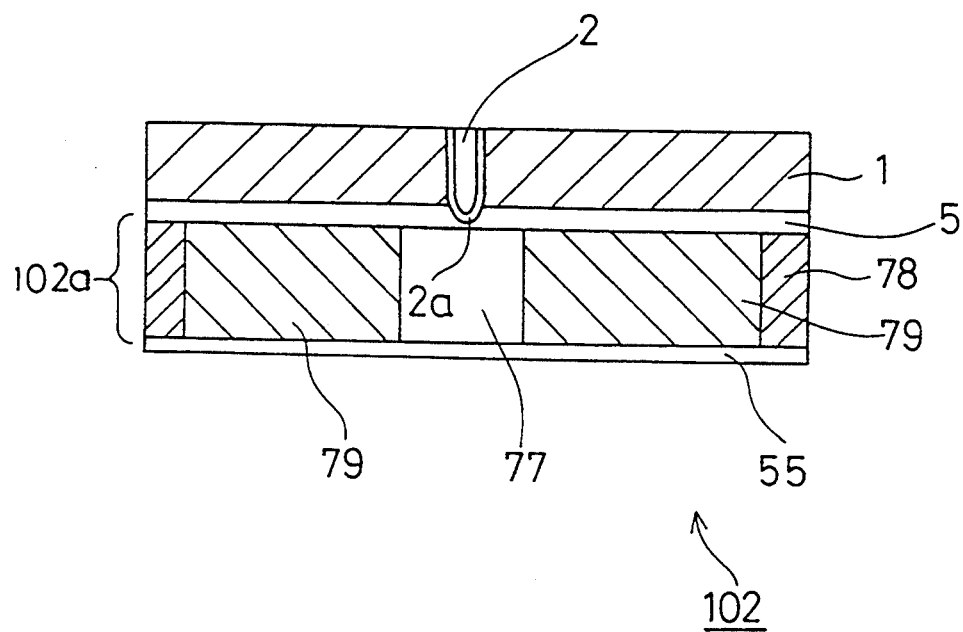
FIG. 3 is a cross-sectional view illustrating a high frequency and high output semiconductor chip in accordance with a second embodiment of the present invention.

FIG. 3 is a cross-sectional view illustrating a semiconductor chip in accordance with a second embodiment of the present invention. FIGS. 4(a)-4(g) are cross-sectional views illustrating process steps in a method for producing the semiconductor chip of FIG. 3. In this second embodiment, the chip supporting substrate 102a includes plated hard metal layers 78 about 40 microns thick disposed opposite the dicing lines on the semiconductor wafer 10. Preferably, the plated hard metal layers comprise Ni or Ni-P. Other elements are identical to those of the above-described first embodiment.

The production process will be described.

The steps up to FIG. 4(a) are identical to those already described with respect to FIGS. 2(a) to 2(c) and, therefore, do not require repeated description.

In FIG. 4(b), a hard metal, such as Ni or Ni-P, is selectively plated on portions of the rear surface of the GaAs wafer 10 opposite the dicing lines by electroplating or electroless plating using a photoresist as a mask, producing the hard metal layers 78 (FIG. 4(b)).

Then, a metal having a linear thermal expansion coefficient approximately equivalent to that of the GaAs wafer, for example, Rh, Pt, or Ni-B-W, is plated on the rear surface of the wafer to a thickness of about 40 microns, forming the plated metal layer 79 (FIG. 4(c)). Alternatively, the plated metal layer 79 may be formed by alternatingly plating Au and one selected from the above-described metals. Thereafter, the rear surface of the structure of FIG. 4(c) is flattened by polishing the plated metal layer 79 until the Au PHS layers 77 and the plated hard metal layers 78 are exposed (FIG. 4(d)).

After forming the plated Au layer 55 on the flattened surface (FIG. 4(e)), the wafer 10 is separated from the glass plate 3 (FIG. 4(f)) and then it is cut along the dicing lines with a blade 8 (FIG. 4(g)).

In this second embodiment, since the plated hard metal layers 78 are formed opposite the dicing lines, no burr is produced during the dicer cutting.

While in the above-described second embodiment Ni or Ni-P is plated on the regions on the rear surface of the wafer opposite the dicing lines, Au-Sn may be plated by electroplating. In this case, the resistance of the semiconductor chip to moisture is improved.

Also in this second embodiment, the chip supporting layer 79 may be formed by applying silica ceramic on the rear surface of the wafer in the same manner as described in the first embodiment.

Figure 5:
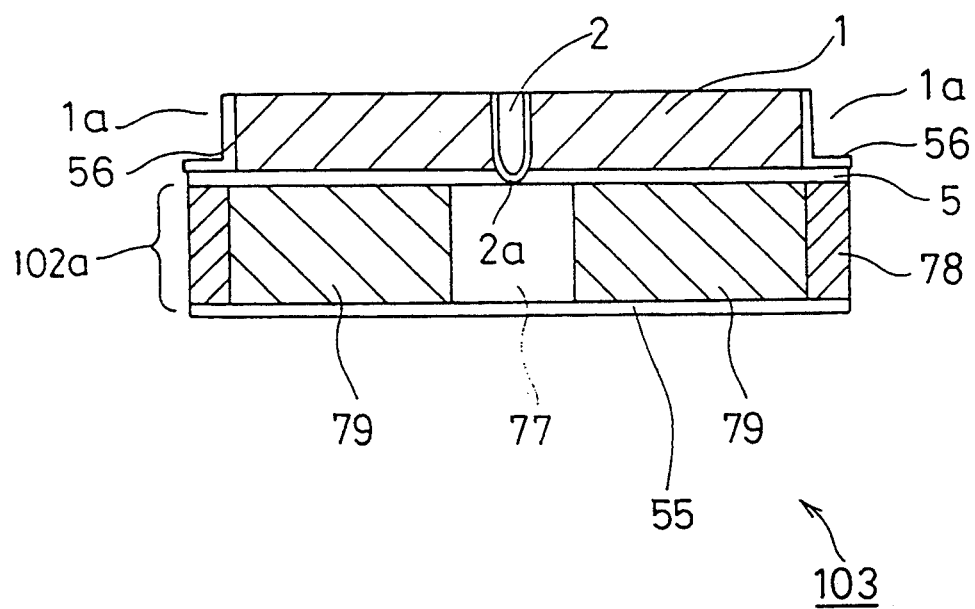
FIG. 5 is a cross-sectional view illustrating a high frequency and high output semiconductor chip in accordance with a third embodiment of the present invention.

FIG. 5 is a cross-sectional view illustrating a semiconductor chip in accordance with a third embodiment of the present invention. FIGS. 6(a)-6(h) are cross-sectional views illustrating process steps in a method for producing the semiconductor chip of FIG. 5. In this third embodiment, chip separation grooves 1a penetrate through portions of the semiconductor wafer 10 opposite the plated hard metal layers 78 of the chip supporting substrate 102a, and metallized Au layers 56 about 3-5 microns thick are disposed in the grooves 1a. Other elements are identical to those of the above-described second embodiment.

The production process will be described.

Initially, FETs (not shown) and via-holes 2 are formed in the surface region of the GaAs wafer 10, and the whole surface of the wafer is coated with a passivation film (not shown), such as an SiON film. Thereafter, a first photoresist pattern 40 is formed on the wafer 10 (FIG. 6(a)). Using the photoresist pattern 40 as a mask, the SiON film and the wafer are etched to form chip separation grooves 1a about 30 microns deep (FIG. 6(b)).

Figure 6:
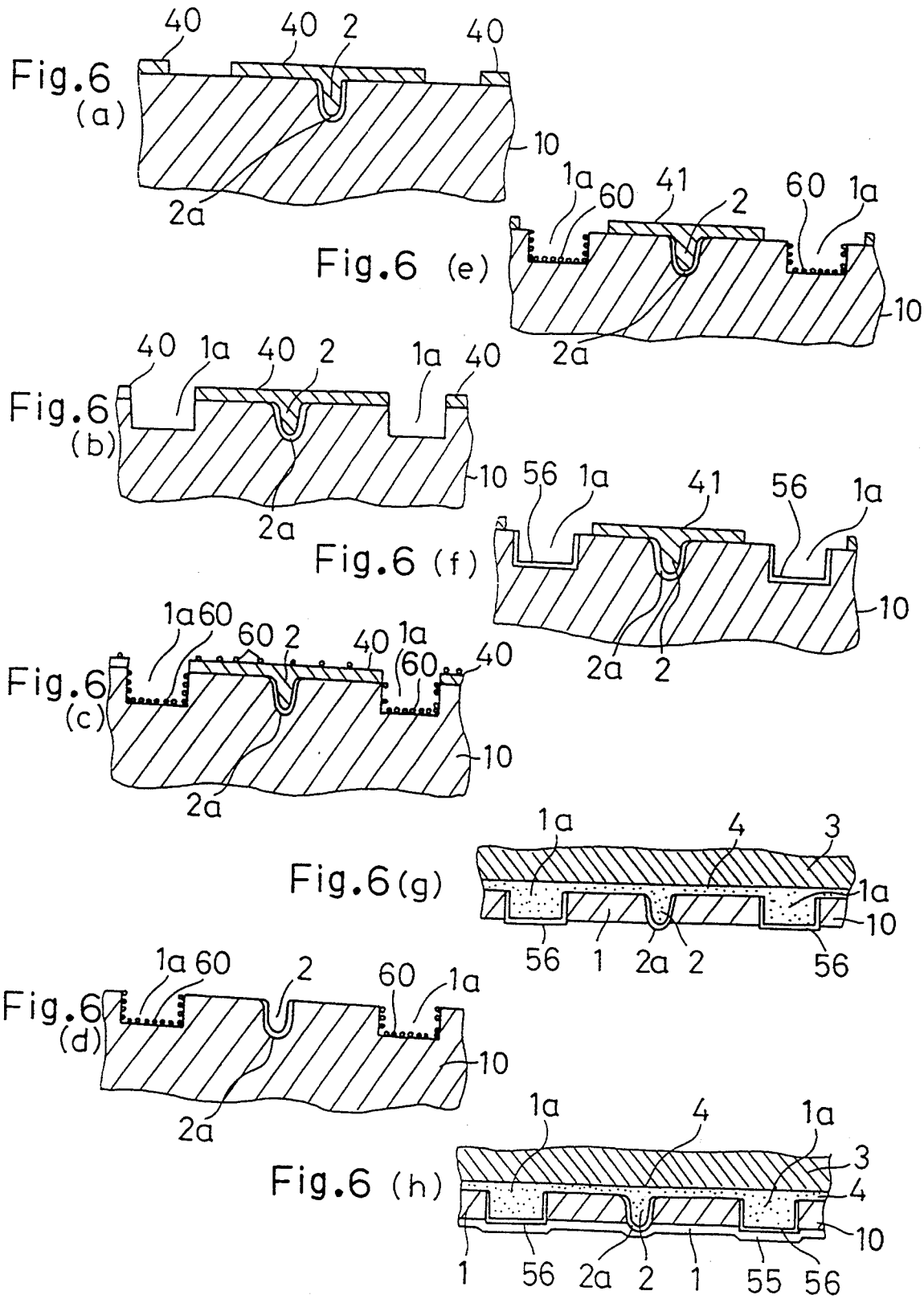
FIGS. 6(a)-6(h) are cross-sectional views illustrating process steps in a method for producing the semiconductor chip of FIG. 5.

Then, Pd activation is applied to the surface of the wafer 10 to deposit Pd nuclei 60 on the GaAs surface exposed in the grooves 1a, which Pd nuclei serve as an intermediate for electroless plating (FIG. 6(c)). An activator including palladium chloride is used for the Pd activation. Thereafter, the first photoresist pattern 40 is removed together with the Pd nuclei 60 deposited thereon (FIG. 6(d)), and a second photoresist pattern 41 is formed on regions on the wafer 10 where the grooves 1a are absent (FIG. 6(e)).

Using the second photoresist pattern 41 as a mask, electroless plating of Ni-P and electroplating of Au are successively carried out on the activated surfaces in the grooves 1a, forming metal layers 56 (FIG. 6(f)).

Then, the surface of the wafer 10 is adhered to the glass plate 3 using wax 4, and the rear surface of the wafer is polished until the metal layers 2a in the via-hole 2 and the metal layers 56 in the grooves 1a are exposed (FIG. 6(g)). At this time, the thickness of the wafer is about 30 microns. Then, an Au layer 55 is formed on the flattened surface by plating (FIG. 6(h)). Subsequent steps are identical to those already described with respect to FIGS. 4(a) to 4(f). Finally, the wafer is divided into chips by cutting through the plated hard metal layers 78 beneath the dicing grooves 1a with a dicing blade.

According to the third embodiment of the present invention, since the grooves 1a are formed from the surface of the GaAs wafer 10 along the dicing lines and the metal layers 56 are plated in the grooves 1a, the wafer 10 is divided into a plurality of chip regions before the dicer cutting, preventing the wafer from breaking or cracking due to mechanical stress applied to the wafer during the wafer test.

In addition, since the adhesion of the metal layer 56 to the plated metal layer 5 is sufficiently large, the adhesion between the chip substrate 1 and the chip supporting substrate 102a is increased by the metal layer In addition, since the wafer 10 is divided into chips by only cutting through the plated hard metal layers 78 along the dicing grooves 1a, workability during the dicer cutting is improved.

While in the above-described third embodiment the activator including palladium chloride is used for the activation of the surface in the dicing grooves 1a, the activation may be carried out by the deposition of a palladium film followed by lift-off.

While in the above-described third embodiment the Pd activation is used for forming a feeding layer for the electroless plating of the metal layers 56 in the grooves 1, the feeding layer may be formed by successively depositing Ti and Au by sputtering. This process will be described in more detail using FIGS. 7(a) to 7(e).

Figure 7:
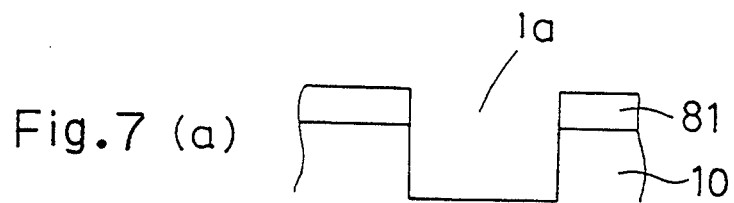
FIGS. 7(a)-7(e) are cross-sectional views illustrating process steps in another method for producing the semiconductor chip of FIG. 5.
Figure 7:
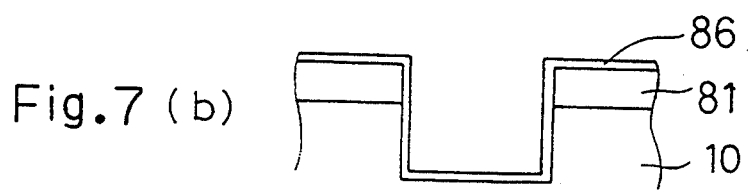
Figure 7:
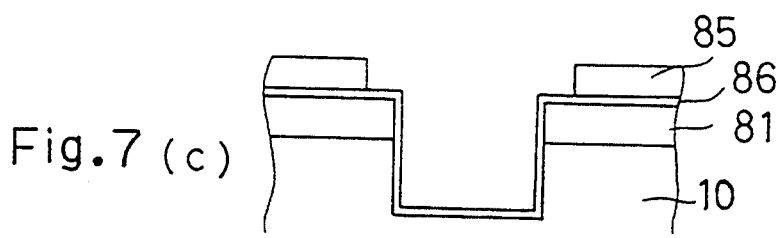
Figure 7:
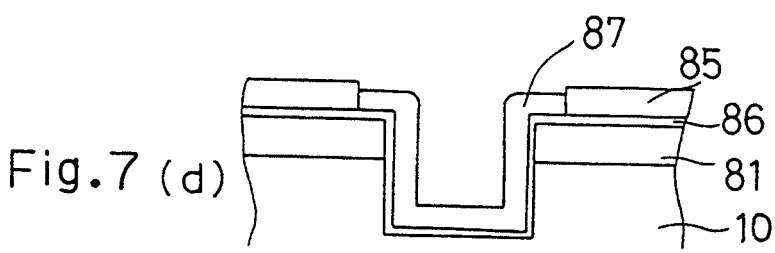
Figure 7:
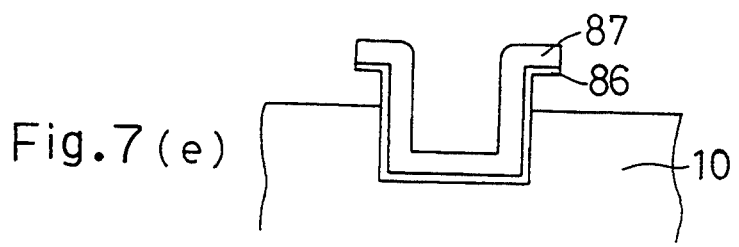

Initially, the GaAs wafer 10 is etched using a first photoresist mask 81 to form the groove 1a (FIG. 7(a)), and Ti and Au are successively deposited over the surface by sputtering, forming a feeding layer 86 (FIG. 7(b)).

Then, a second photoresist mask 85 is formed (FIG. 7(c)), and electroplating is carried out using the photoresist mask 85, forming an Au layer 87 in the groove 1a (FIG. 7(d)). Thereafter, the first photoresist mask 81 is removed together with the second photoresist mask 85 and the overlying portions of the feeding layer 86 by lift-off (FIG. 7(e)).

Figure 8A:
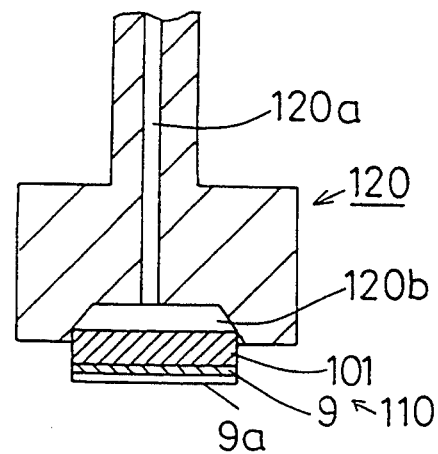
FIGS. 8(a)-8(c) are cross-sectional views illustrating a method for mounting a semiconductor chip on a chip carrier in accordance with a fourth embodiment of the present invention.
Figure 8B:
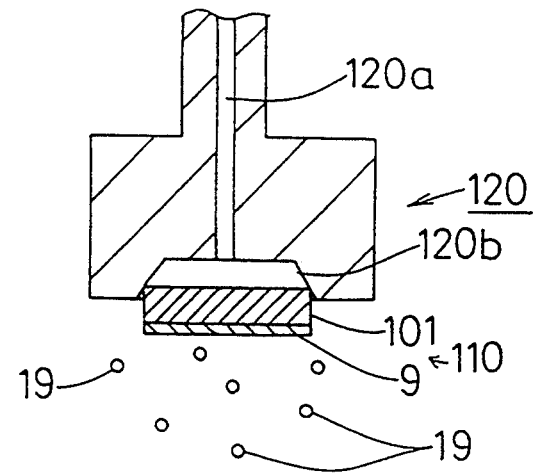
Figure 8C:
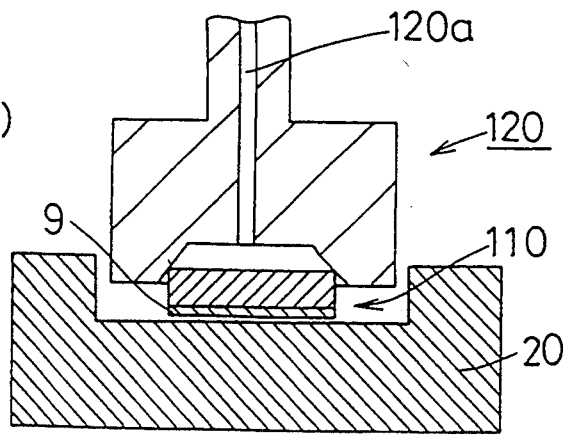
Figure 9A:
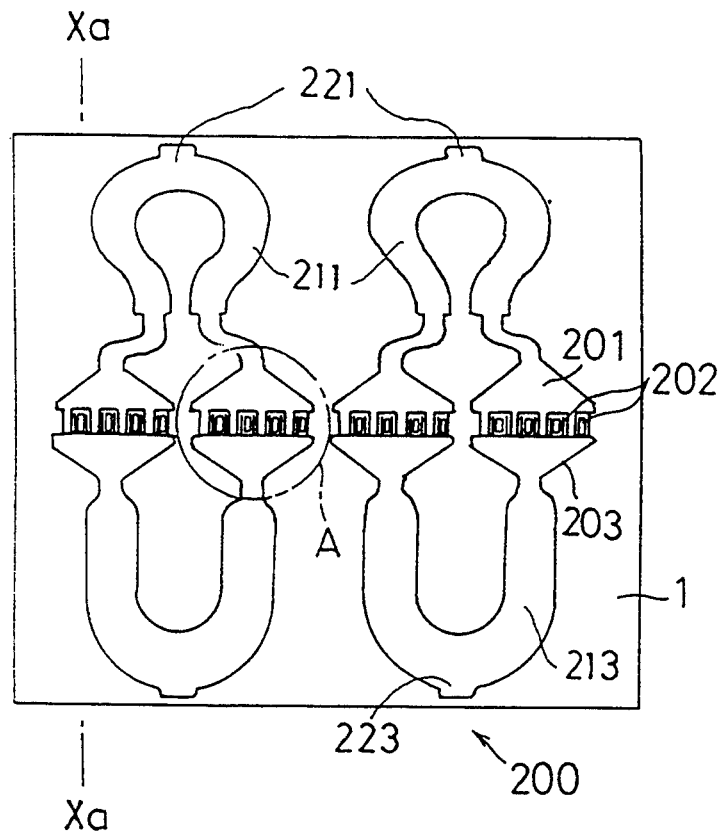
FIGS. 9(a) and 9(b) are plan views illustrating a high frequency and high output GaAs MMIC chip in accordance with the prior art.
Figure 9B:
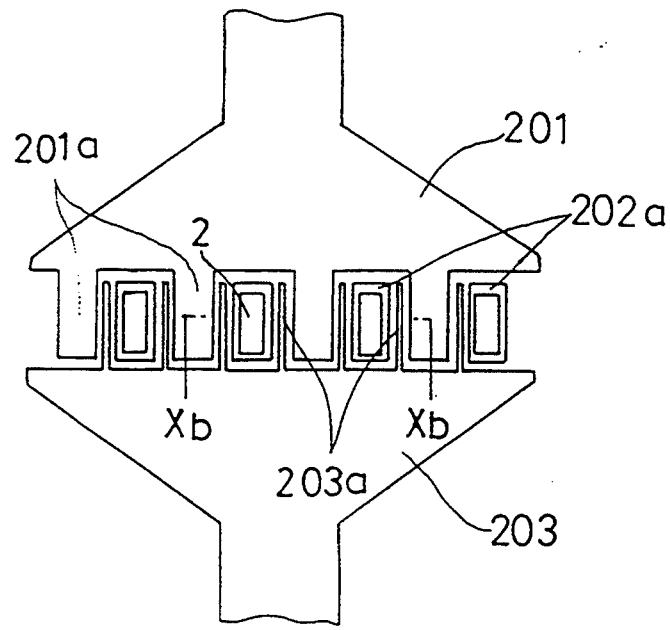
Figure 10A:
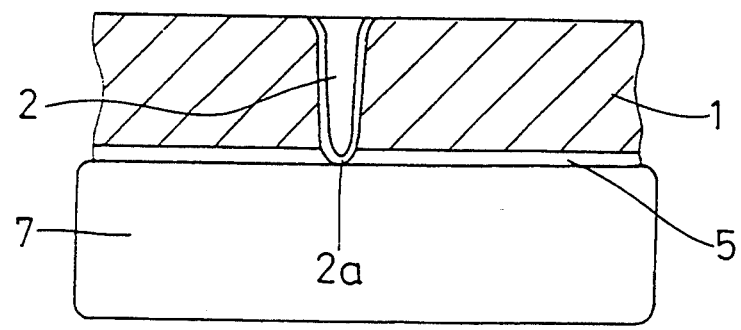
FIGS. 10(a) and 10(b) are cross-sectional views taken along lines Xa—Xa of FIG. 9(a) and Xb—Xb of FIG. 9(b), respectively.
Figure 10B:
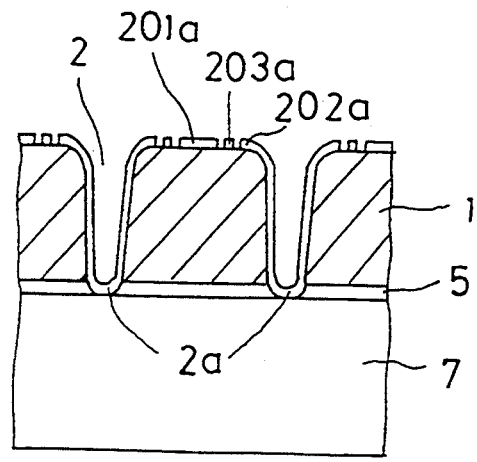

FIGS. 8(a)-8(c) are cross-sectional views illustrating a method for mounting a semiconductor chip on a chip carrier, in accordance with a fourth embodiment of the present invention. In the figures, reference numeral 120 designates a collet for picking up a semiconductor chip. The semiconductor chip is fixed to a concave part 120b of the collet by evacuating air through a hole 120a.

An Au-Sn alloy solder 9 is applied to the rear surface of the semiconductor chip 101 of FIG. 1 by electroplating. An oxide film is produced on the surface of the solder layer 9.

A description is given of the mounting method.

Initially, the semiconductor chip 101 with the solder 9 is picked up using the collet 120 (FIG. 8(a)) and then it is put in a reducing atmosphere 19, such as a mixture of hydrogen and nitrogen, or a plasma atmosphere to remove the oxide film 9a on the surface of the solder layer 9 (FIG. 8(b)).

Thereafter, the semiconductor chip 101 is put on the chip carrier 20 which is heated to about 300° C. and, in this state, the semiconductor chip and the chip carrier are cooled to the room temperature (FIG. 8(c)).

According to the fourth embodiment of the present invention, the step of rubbing the semiconductor chip against the chip carrier 20 to increase the adhesion between the solder and the chip carrier can be dispensed with. In addition, since the quantity of the solder is controlled by the thickness of the plated Au-Sn solder layer 9, the pressed-out portion of the solder beneath the semiconductor chip is reduced.

In addition, since the semiconductor chip is pressed onto the chip carrier 20 by the collet 120 while cooling the chip and the carrier, the curvature of the chip is suppressed.

While in the above-described embodiments Au or Cu PHS is employed, the PHS may comprise other metals or other alloys so long as it has a high thermal conductivity.

While in the above-described embodiments a GaAs substrate is employed as the chip substrate 1, the chip substrate 1 may be an Si substrate, an InP substrate, an Si substrate with a GaAs layer epitaxially grown thereon, or a ceramic substrate.

What is claimed is:

1. A semiconductor device structure comprising:
   a semiconductor substrate having opposite front and rear surfaces and an active element on the front surface; and
   a supporting substrate supporting said semiconductor substrate and disposed on the rear surface of the semiconductor substrate, said supporting substrate comprising:
   a radiating layer for radiating heat generated by said active element and disposed on a part of the rear surface of said semiconductor substrate directly opposite said active element, and p2 a plated metal layer selected from the group consisting of Rh, Pt, and Ni-B-W, said plated metal layer having a linear thermal expansion coefficient nearer to the linear thermal expansion coefficient of said semiconductor substrate than the linear thermal expansion coefficient of said radiating layer and disposed on part of the rear surface of said semiconductor substrate but not directly opposite said active element.

2. The semiconductor device structure of claim 1 wherein said semiconductor substrate includes dicing lines extending into said substrate at the front surface and said supporting substrate includes plated hard metal layers comprising a metal harder than other portions of said supporting substrate disposed on part of the rear surface of said semiconductor substrate directly opposite the dicing lines.

3. The semiconductor device structure of claim 2 wherein said plated hard metal layers are selected from the group consisting of Ni, Ni-P, and Au-Sn alloy.

4. The semiconductor device structure of claim 2 comprising a second metal layer disposed in the dicing lines.

5. A semiconductor device structure comprising;
   a semiconductor substrate having opposite front and rear surfaces, dicing lines extending into said substrate at the front surface, and an active element on the front surface; and
   a supporting substrate supporting said semiconductor substrate and disposed on the rear surface of the semiconductor substrate, said supporting substrate comprising:
   a metal harder than other portions of said supporting substrate disposed on part of the rear surface of said semiconductor substrate directly opposite the dicing lines;
   a radiating layer for radiating heat generated by said active element and disposed on a part of the rear surface of said semiconductor substrate directly opposite said active element, and
   a ceramic layer having a linear thermal expansion coefficient nearer to the linear thermal expansion coefficient of said semiconductor substrate than the linear thermal expansion coefficient of said radiating layer and disposed on part of the rear surface of said semiconductor substrate but not directly opposite said active element.

6. The semiconductor device structure of claim 5 wherein said metal is selected from the group consisting of Ni, Ni-P, and Au-Sn alloy.

7. A semiconductor device structure comprising:
   a semiconductor substrate having opposite front and rear surfaces and an active element on the front surface; and
   a supporting substrate supporting said semiconductor substrate and disposed on the rear surface of the semiconductor substrate, said supporting substrate comprising;
   a radiating layer for radiating heat generated by said active element and disposed on a part of the rear surface of said semiconductor substrate directly opposite said active element, and
   a plated metal layer comprising, alternatingly laminated, Au and one selected from the group consisting of Rh, Pt, and Ni-B-W, said plated metal layer having a linear thermal expansion coefficient nearer to the linear thermal expansion coefficient of said semiconductor substrate than the linear thermal expansion coefficient of said radiating layer and disposed on part of the rear surface of said semiconductor substrate but not directly opposite said active element.

8. The semiconductor device structure of claim 7 wherein said semiconductor substrate includes dicing lines extending into said substrate at the front surface and said supporting substrate includes plated hard metal layers comprising a metal harder than other portions of said supporting substrate disposed on part of the rear surface of said semiconductor substrate directly opposite the dicing lines.

9. The semiconductor device structure of claim 8 wherein said plated hard metal layers are selected from the group consisting of Ni, Ni-P, and Au-Sn alloy.

10. The semiconductor device structure of claim 8 comprising a second metal layer disposed in the dicing lines.

* * * * *